(12) United States Patent
Joshi

(10) Patent No.: US 9,468,087 B1
(45) Date of Patent: Oct. 11, 2016

(54) POWER MODULE WITH IMPROVED COOLING AND METHOD FOR MAKING

(71) Applicant: Texas Instruments Incorporated, Dallas, TX (US)

(72) Inventor: Rajeev Dinkar Joshi, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/797,510

(22) Filed: Jul. 13, 2015

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 23/02 | (2006.01) |
| H01L 23/10 | (2006.01) |
| H01L 23/34 | (2006.01) |
| H01L 21/76 | (2006.01) |
| H05K 1/02 | (2006.01) |
| H02M 7/00 | (2006.01) |
| H05K 1/18 | (2006.01) |
| H05K 7/20 | (2006.01) |
| H05K 3/34 | (2006.01) |

(52) U.S. Cl.
CPC .......... *H05K 1/0204* (2013.01); *H02M 7/003* (2013.01); *H05K 1/181* (2013.01); *H05K 3/34* (2013.01); *H05K 7/20409* (2013.01); *H05K 2201/066* (2013.01); *H05K 2201/10166* (2013.01)

(58) Field of Classification Search
CPC .... H05K 1/0204; H05K 1/181; H02M 7/003
USPC .......... 257/368, 686, 706; 438/435
See application file for complete search history.

(56) References Cited

U.S. PATENT DOCUMENTS

| | | |
|---|---|---|
| 8,524,532 B1 | 9/2013 | Joshi |
| 2003/0085456 A1 | 5/2003 | Lee et al. |

(Continued)

OTHER PUBLICATIONS

Application Engineering Part Motion Control System Team HV PCIA Fairchild Semiconductor,Application Note AN-9044, "Smart Power Module Motion SPM® in Mini DIP (SPM3 V4) User's Guide", Jul. 9, 2012, pp. 1-64.
SanKen Electric Co., Ltd., SanKen Preliminary, "600 V, 18 A, IGBT with Fast Recovery Diode FGD633", FGD633-DS Rev.0.6, Mar. 12, 2015, pp. 1-11.

(Continued)

*Primary Examiner* — David S Blum
(74) *Attorney, Agent, or Firm* — John R. Pessetto; Frank D. Cimino

(57) ABSTRACT

Disclosed examples include power modules and fabrication methods therefor in which one or more power device dies include a switching device and a second device die with a circuit component are mounted to a lead frame or other interconnect structure on a substrate structure, and a body structure is formed around portions of the power module providing a first opening to expose a portion of the substrate structure to provide an externally accessible first exposed surface along the top of the power module, and the body structure includes a second opening exposing a portion of the first device die along the bottom of the power module to provide a thermally conductive path to draw heat away from the power device dies.

20 Claims, 13 Drawing Sheets

(56) References Cited

U.S. PATENT DOCUMENTS

| | | | |
|---|---|---|---|
| 2004/0188706 A1* | 9/2004 | Chang | H01L 25/072 257/177 |
| 2006/0151861 A1* | 7/2006 | Noquil | H01L 23/36 257/676 |
| 2007/0138651 A1* | 6/2007 | Hauenstein | H01L 23/13 257/782 |
| 2007/0215996 A1 | 9/2007 | Otremba | |
| 2007/0262346 A1 | 11/2007 | Otremba et al. | |
| 2008/0017907 A1 | 1/2008 | Otremba | |
| 2008/0061396 A1 | 3/2008 | Havanur | |
| 2011/0070699 A1 | 3/2011 | Liu et al. | |
| 2013/0221442 A1 | 8/2013 | Joshi | |
| 2014/0071650 A1 | 3/2014 | Flores et al. | |

OTHER PUBLICATIONS

Fairchild Semiconductor Corporation, AN-9077, "Motion SPM® 7 Series User's Guide", Rev. 1.0.2, Aug. 22, 2014, pp. 1-24.

Infineon, "Mounting instructions for PressFIT modules with forked pins: EconoPACK™ / EconoPIM™ / EconoBRIDGE™", Application Note AN 2007-09-V2.0, Nov. 2012, pp. 1-16.

Fairchild Semiconductor®, "FCAS20DN60BB Smart Power Module for SRM", Fairchild Semiconductor Corporation FCAS20DN60BB Rev. A, Jan. 2008, pp. 1-14.

Mitsubishi Electric, "Mitsubishi Electric DIPIPM™ Ver.6 Shindengen Converter-Brake Power Module", May 2015, 4 pgs.

Fairchild Semiconductor Corporation, "Smart Power Module for SRM", FCAS20DN60BB, Rev. A, 2008, pp. 1-21.

* cited by examiner

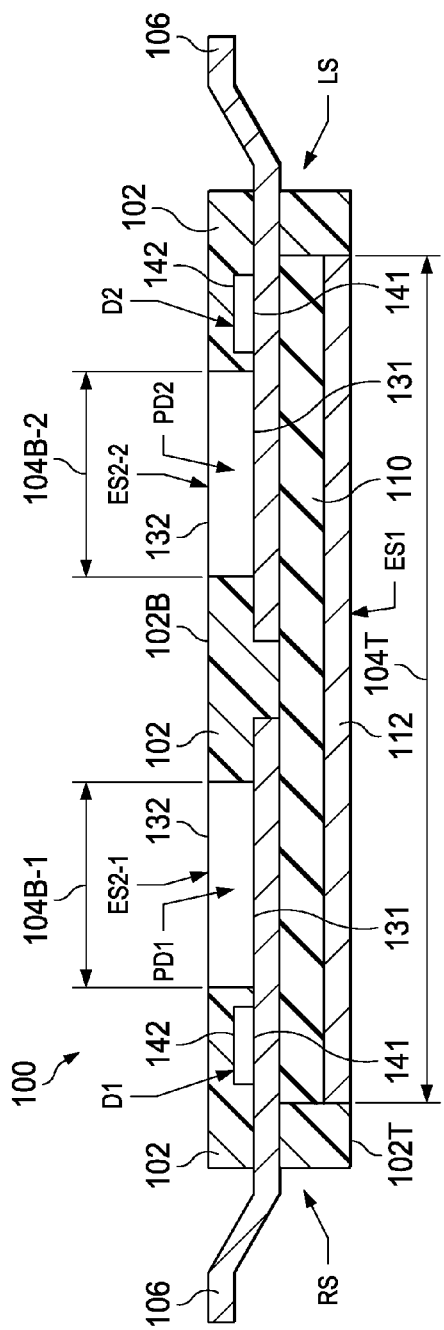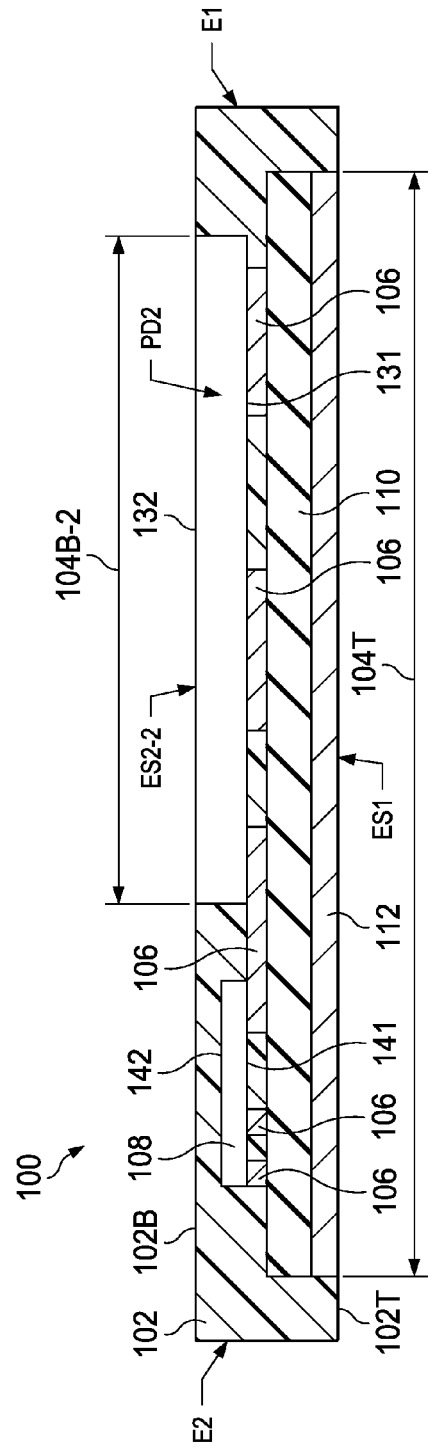

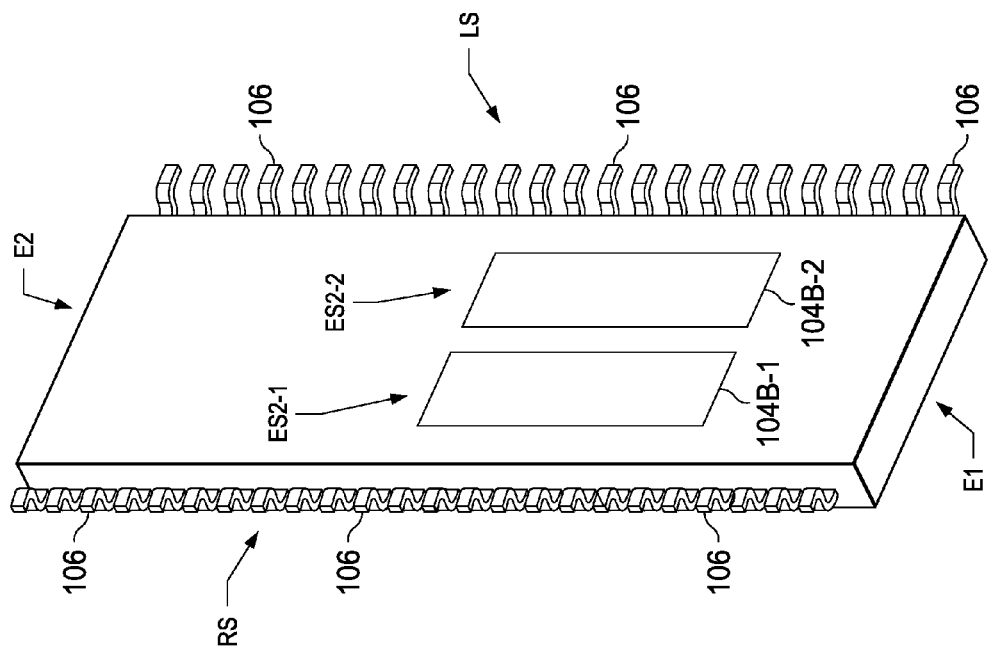
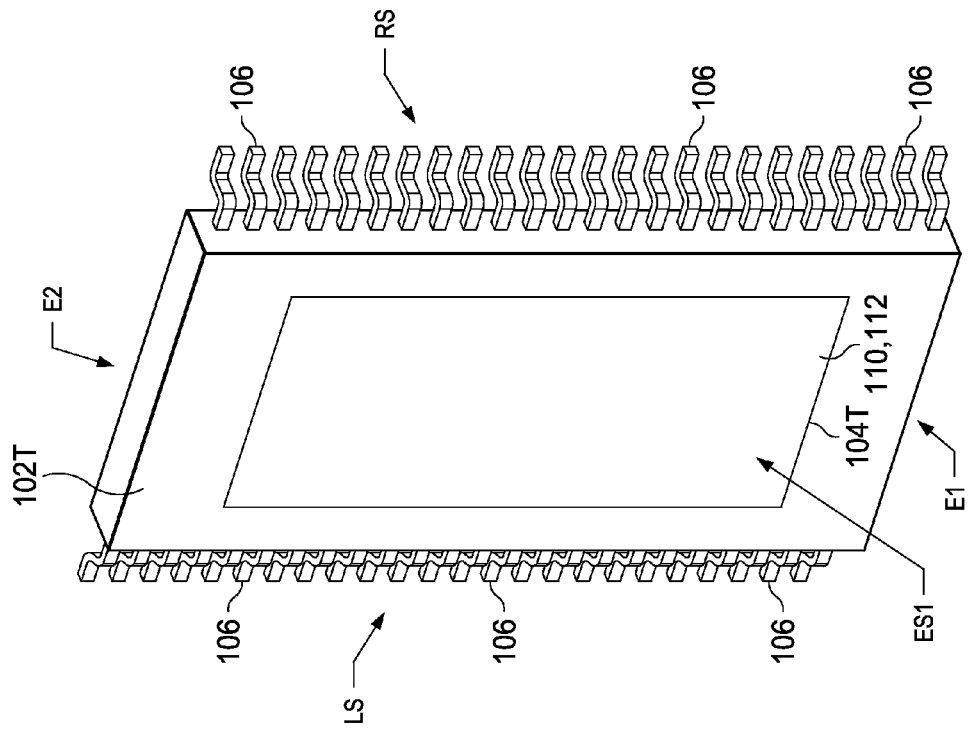

POWER MODULE WITH IMPROVED COOLING AND METHOD FOR MAKING

TECHNICAL FIELD

The present disclosure relates generally to power modules and more particularly to power modules with upper and lower cooling openings.

BACKGROUND

Power modules integrate switching devices with further electrical circuit components in a single package for use in inverters, switching rectifiers or other power converters. High voltage power modules provide single package solutions for full or half-bridge circuits or multi-phase converters in a large form factor package used in high voltage power conversion applications. Many power modules are rated for operation at 1 kW or more, and heatsink components are often connected to the power module to dissipate thermal energy to maintain proper operating temperature of the integrated power switches. For high voltage systems, moreover, minimum spacing distances are required for physical separation of high-voltage components. Isolation specifications typically require electrically insulating encapsulation materials such as molded plastic to construct the integrated power module. However, the encapsulation material is typically a thermal insulator, and heat removal is accomplished by thermal conduction through an external heatsink bolted or otherwise mounted onto the integrated power module package to dissipate heat from one face of a switch component die through a substrate which is connected to the heatsink.

For low voltage power modules, molded resin plastic material encapsulates a power switch and other included circuit components to provide an unexposed structure having a relatively high thermal junction coefficient $\theta jc$. There are also low voltage power modules with exposed structures to increase heat dissipation using external heat sinks, for example, when heat sinking to a circuit board is not enough due to the power loss of the module. Some such packaging approaches include the use of an exposed ceramic substrate to reduce the thermal coefficient $\theta jc$. However, this approach increases module cost. FIG. 19 shows a high voltage power module 300 including a molded resin body 302 with a chip 304 including a semiconductor switching device (e.g., transistor) with connections to a lead frame 306 along with an integrated driver chip or IC 308 and a diode D. Wire bonding interconnections 320 connect the power switch chip 304 with the diode D and the driver chip 308, with the lead frame 306 providing external connections to other circuitry on a host circuit board (not shown). A substrate 310 is mounted to the lead frame 306 with an externally exposed substrate surface allowing interfacing with an external heatsink (not shown) to dissipate power from the power switch 304 and the diode D. As further shown in FIG. 20, direct bonded copper (DBC) approaches provide a conductive copper structure 312 mounted to the substrate 310 and exposed for connection to an external heatsink (not shown) to further reduce the thermal junction coefficient $\theta jc$. However, DBC techniques involve a further trade off with respect to higher module substrate cost and manufacturing complexity and a reduced supply chain of available vendors. Thus, lowering the thermal junction resistance $\theta jc$ allows higher current carrying capacity for a given application but increases the component cost.

The individual components within power modules are interconnected using wire bonding techniques. For high current interconnections, the use of multiple low impedance gold wires is often cost-prohibitive, and lower cost heavy gauge aluminum wire or ribbon wiring interconnections are often used instead. These wire-based interconnections, however, result in parasitic impedances which can adversely impact performance of the converter system in which the power module is used.

SUMMARY

In described examples, power modules and fabrication methods are provided with device dies individually having a first side mounted to an interconnect structure with a connected substrate. A body structure provides a first opening to expose a portion of the substrate structure along the top of the power module, as well as a second opening to expose a portion of at least one device die along the bottom of the power module. In at least one example, a conductor structure is provided in contact with the substrate, with the first opening exposing a portion of the conductor structure along the top of the module. The first body opening in disclosed examples provides an externally accessible first exposed surface to provide a thermally conductive path to draw heat away from the first side of the device die or dies. In addition, the second opening provides an externally accessible second exposed surface of the device die to draw heat away from the second side of the device die. In this manner, the described examples increase the thermally conductive area to facilitate enhanced heat removal from power switches and other device dies of the power module for a given module size and power rating.

In at least one example, conductive features of the first side of the device dies are soldered to the interconnect structure to form electrical contacts, for example, using flip-chip reflow soldering techniques, offering an alternative to mitigate the parasitic effects associated with conventional wire-bonding interconnections. Disclosed examples include lead frame type interconnect structures having one or more leads extending outward from the body structure. In at least some examples, a first device die includes a switching device such as an IGBT, high voltage MOSFET, silicon carbide MOSFET, gallium nitride MOSFET, etc. The switch includes a plurality of switch terminals, as well as a second device die with at least one electrical circuit component, such as fast recovery flyback diodes and/or switch driver circuitry for integration in a power module for use in a switching power supply. In some examples, two or more power device dies are provided in the power module, each having a switching device. In at least some examples, moreover, the body structure includes an additional opening exposing at least a portion of a second side of the second device die to create an additional exposed surface along the bottom of the power module to create a thermally conductive path to draw heat away from the second device die.

In described examples, methods are provided for fabricating a power module, including mounting an interconnect structure to a substrate, as well as mounting first and second device dies to the interconnect structure, and forming a body structure around portions of the power module, including providing a first opening exposing at least a portion of the substrate structure along a top of the power module, and providing a second opening exposing at least a portion of the first device die along a bottom of the power module. In at least one example, the method include soldering one or more conductive features of a first side of the first device die to the interconnect structure to form an electrical contact to at least one switch terminal, and soldering at least one conductive feature of a first side of the second device die to the interconnect structure. In at least one example, at least one additional opening is provided while forming the body structure to expose at least a portion of the second device die along the bottom of the power module. In certain examples, a conductor structure is mounted to the substrate, with the first opening of the body structure exposing at least a portion of the conductor structure along the top of the power module.

DESCRIPTION OF THE VIEWS OF THE DRAWINGS

FIG. 8 is a sectional end elevation view of a second embodiment of the power module of FIGS. 1, 4 and 5 taken along line 6-6 in FIG. 5.

FIG. 9 is a sectional side elevation view of the second embodiment of the power module of FIGS. 1, 4, 5 and 8 taken along line 7-7 in FIG. 5.

FIG. 10 is a top perspective view showing the power module of FIGS. 1 and 4-7.

FIG. 11 is a bottom perspective view showing the power module of FIGS. 1, 4-7 and 10.

DETAILED DESCRIPTION

Figure 1:
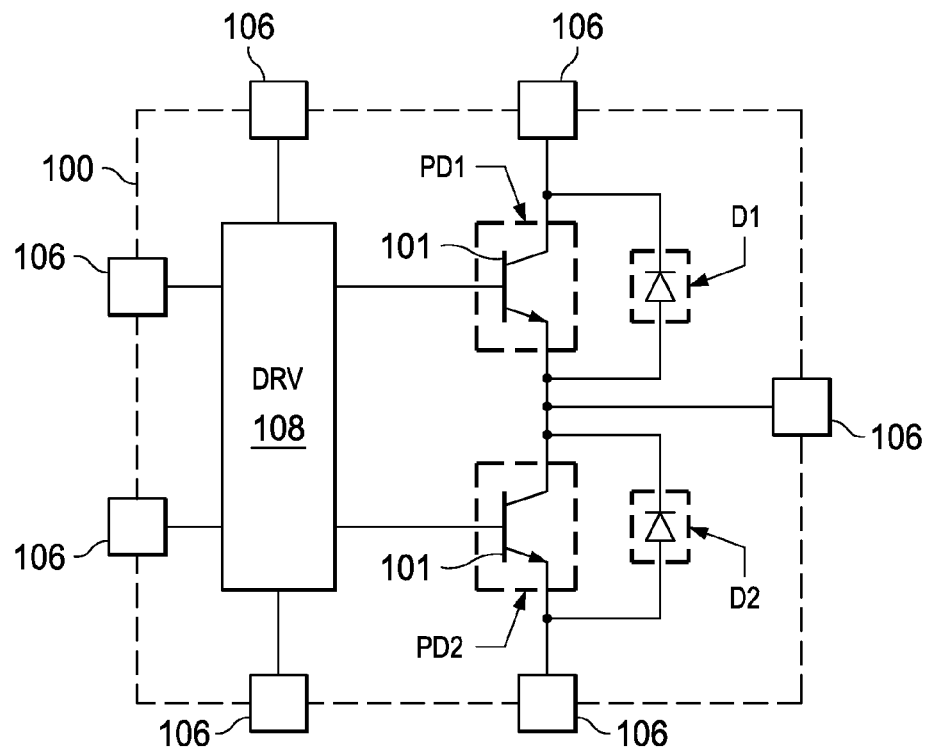
FIG. 1 is a schematic diagram of a first half-bridge power module with IGBT power devices and associated fast recovery diodes and a driver circuit.

In the drawings, like reference numerals refer to like elements throughout, and the various features are not necessarily drawn to scale.

Figure 2:
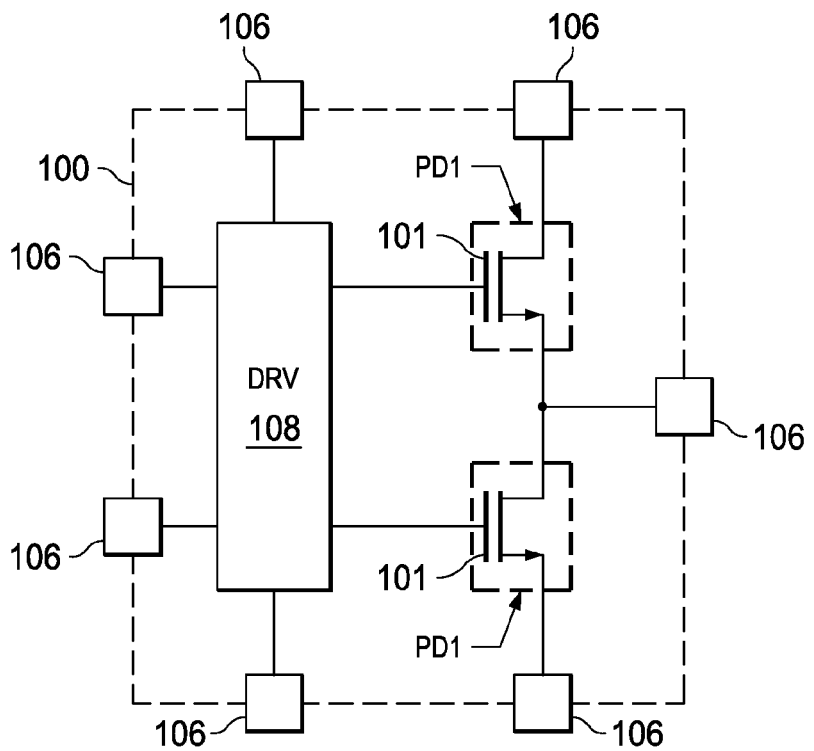
FIG. 2 is a schematic diagram of a second half-bridge power module with MOSFET power devices and a driver circuit.
Figure 3:
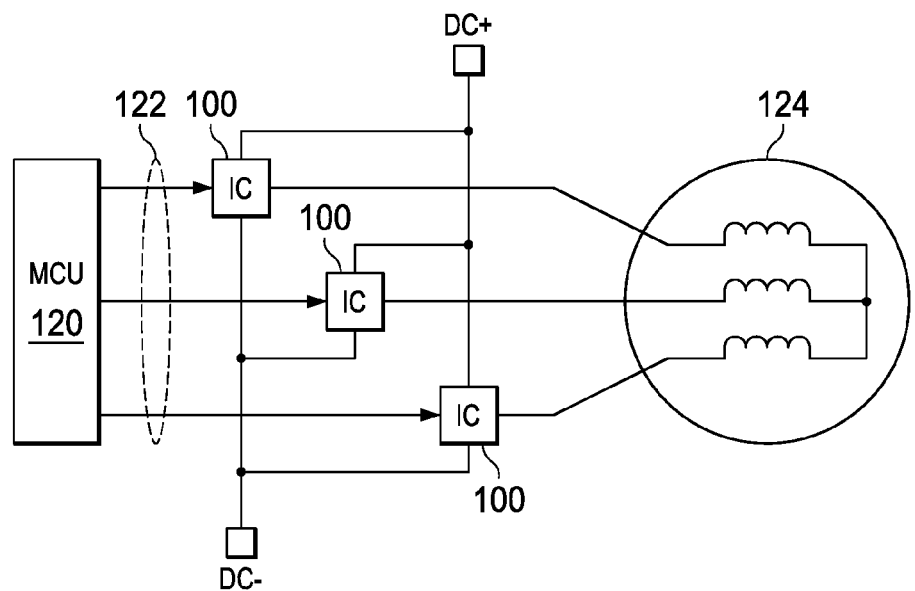
FIG. 3 is a schematic system diagram of a three-phase power converter including three half-bridge power modules to drive a three-phase load based on control signals from a main control unit.

Referring initially to FIGS. 1-3, FIGS. 1 and 2 schematically illustrate two examples of a half-bridge power module 100 with first and second power device dies PD1 and PD2, each including a semiconductor switching device 101. The switching devices 101 of the power device dies PD1 and PD2 are connected in series with one another to form a half-bridge power switching circuit. The module 100 in FIG. 1 includes IGBT type switching devices 101. In this example, further device dies 108, D1 and D2 are provided in the power module 100. A fast recovery diode D1 is connected across the collector and emitter of the IGBT 101 of the die PD1, and a fast recovery diode D2 is connected across the collector and emitter of the IGBT 101 of the die PD2. In addition, a driver IC or chip die 108 is included in the module 100 to provide switching control signals to gate terminals of the IGBTs of PD1 and PD2. The Example module 100 in FIG. 2 includes FET switching devices 101, each having a gate, a source and a drain. Examples of suitable FET switching devices 101 include silicon carbide (SiC) MOSFET switches and gallium nitride (GaN) MOSFETs. In one example, no anti-parallel diodes are included in the module 100, and the module 100 includes a driver device die 108 providing switching control signals to the FETs 101. As seen in FIGS. 1 and 2, and interconnect structure 106 is provided to create externally accessible electrical connections for providing power and signaling to and from the components of the device dies PD1, PD2, D1, D2 and 108, allowing the module 100 to be soldered to a circuit board or wiring board for interconnection with external circuit components (not shown) to form a switching power supply, such as a half-bridge inverter circuit in one example.

FIG. 3 shows a three-phase power converter four switching power supply including three half-bridge power modules 100 individually for providing an inverter output phase for driving a three phase motor or other load 124 by selectively switching DC input power from connections DC+ and DC− according to switching control signals 122 from a motor control unit (MCU) 120. In one example, the MCU 120 and the power modules 100 amount it to a circuit board (not shown) having external connections to receive DC power and to provide phase outputs from the output nodes of the individual half-bridge switching circuits of the modules 100.

Figure 4:
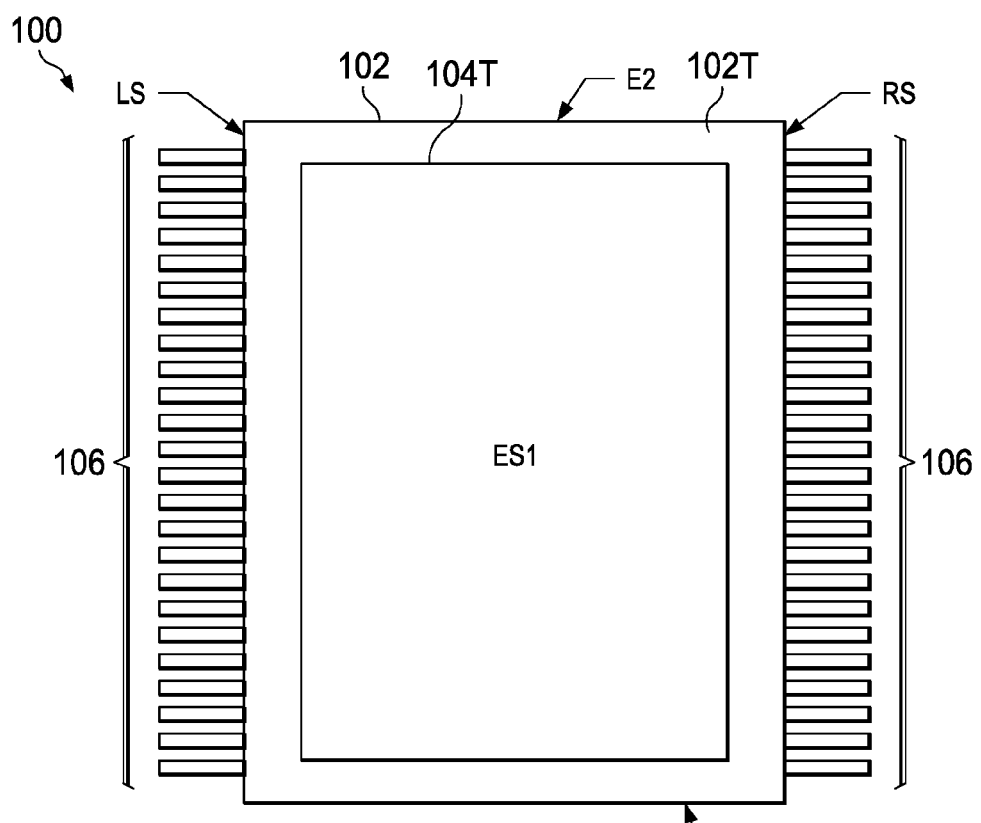
FIG. 4 is a top plan view of the power module of FIG. 1 including a first exposed surface for removing heat from a first side of the IGBT power devices along a top side of the power module.

Referring now to FIGS. 4-7, FIGS. 4 and 5 respectively show top and bottom views of an example integrated circuit or power module 100 as described above in connection with FIG. 1. The module 100 in this example is a generally rectangular structure including a body structure 102 with a top side 102T (FIG. 4) and a bottom side 102B (FIG. 5) extending between first and second ends E1 and E2, with interconnect structure leads 106 extending outward from left and right body sides LS and RS. The top side of the body structure 102 in this example includes a first opening 104T providing a first exposed surface ES1 (FIG. 4). The bottom side of the body structure 102 includes a pair of second openings 104B-1 and 104B-2 providing exposed surfaces ES2-1 and ES2-2 exposing portions of a side of the power device dies PD1 and PD2, respectively.

Figure 5:
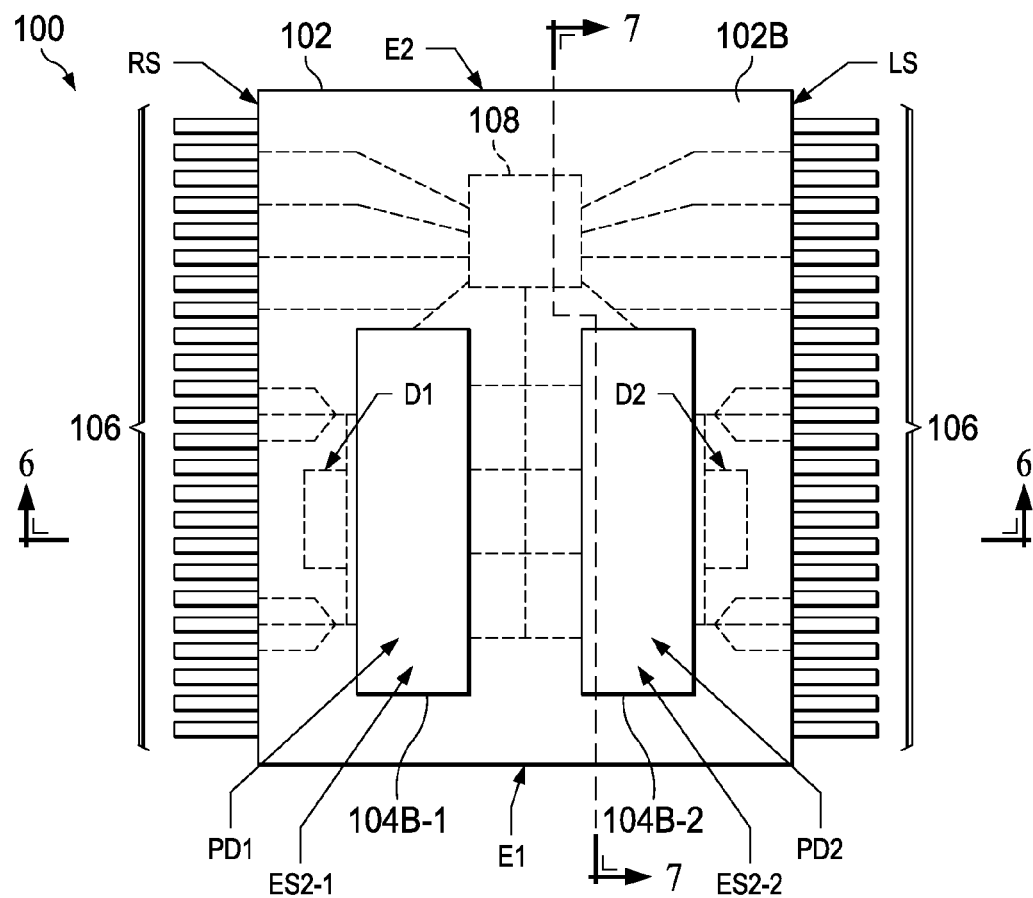
FIG. 5 is a bottom plan view of the power module of FIGS. 1 and 4 including a pair of second exposed surfaces for removing heat from second sides of the IGBT power devices along a bottom side of the power module.
Figure 6:
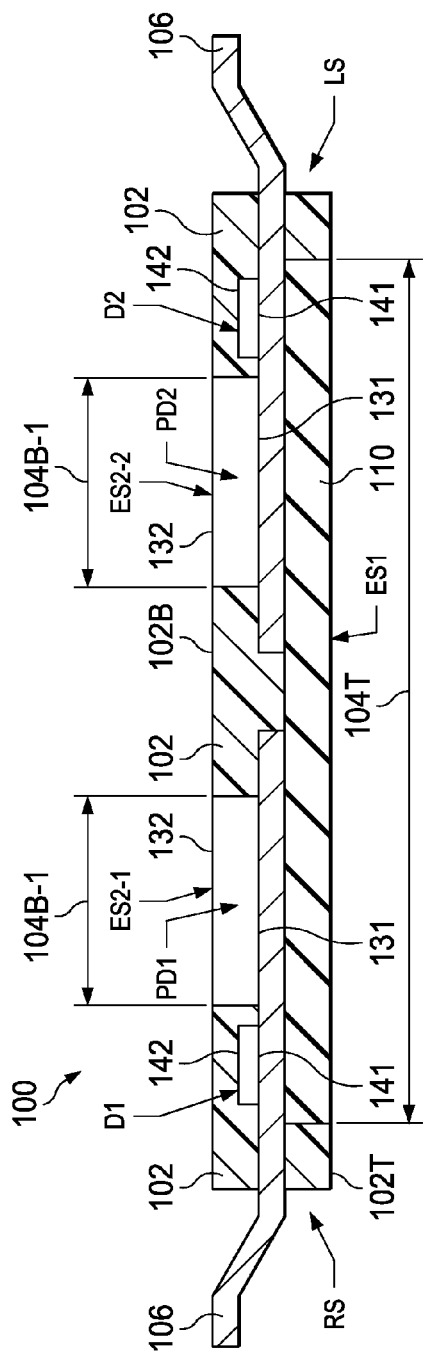
FIG. 6 is a sectional end elevation view of the power module of FIGS. 1, 4 and 5 taken along line 6-6 in FIG. 5.
Figure 7:
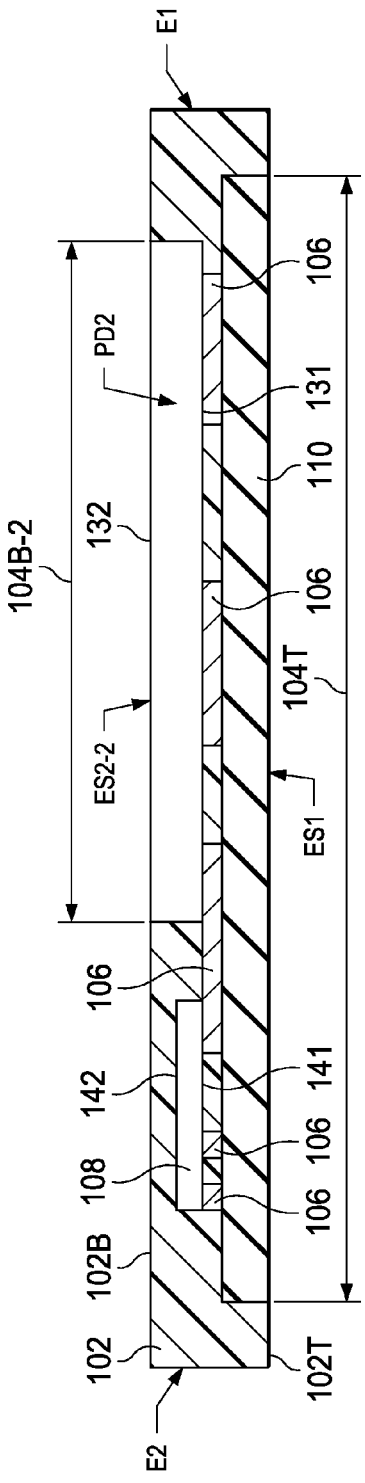
FIG. 7 is a sectional side elevation view of the power module of FIGS. 1 and 4-6 taken along line 7-7 in FIG. 5.

FIG. 6 shows a sectional end elevation view along line 6-6 of FIG. 5, and FIG. 7 shows a sectional side elevation view of the module 100 along line 7-7 of FIG. 5, where internal components D1, D2 and 108 of the power module 100 are shown in dashed line in FIG. 5, along with schematically illustrated lead frame interconnections to one or more of the illustrated module leads 106. In one example, the interconnect structure 106 is a lead frame structure formed of electrically and thermally conductive material, such as copper, aluminum, etc. As shown in FIGS. 6 and 7, first device dies PD1 and PD2 in this example are powered device dies individually including a first side 131 and a second side 132, where the dies PD1 and PD2 include IGBT switching devices 101 and associated switch terminals (gate, collector and emitter) as schematically shown in FIG. 1 above. Second or further device dies D1 and D2 are shown in the section view of FIG. 6, and a driver device die 108 is shown in the section view of FIG. 7, where the device dies D1, D2 and 108 each include a first side 141 and a second side 142.

Figure 19:
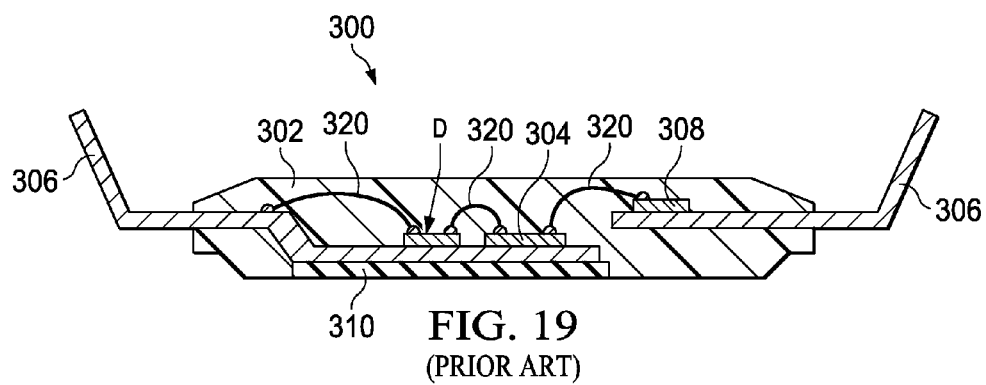
FIG. 19 is a partial sectional end elevation view of a power module with a partially exposed substrate.
Figure 20:
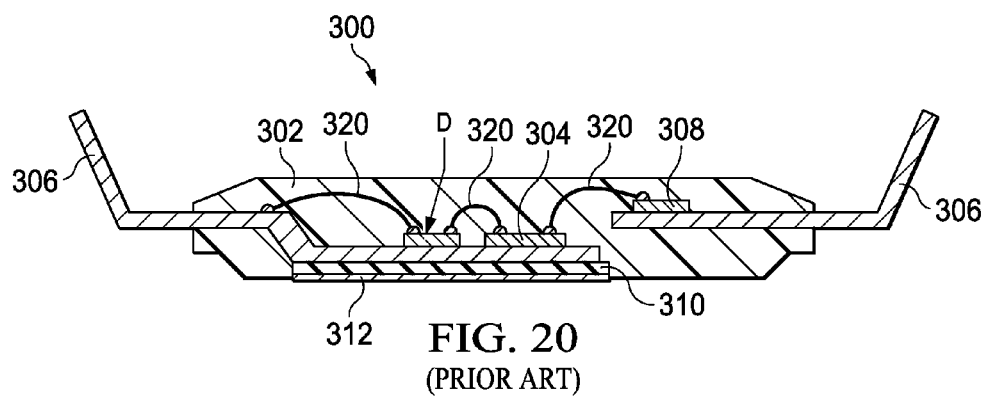
FIG. 20 is a partial sectional end elevation view of a power module with a thermally exposed substrate using direct bonded copper (DBC).

As seen in FIGS. 6 and 7, at least a portion of the first sides 131 of the power device dies PD1 and PD2 are mounted to an in contact a first side of the interconnect structure 106. In addition, the first side of the interconnect structure 106 contacts at least a portion of the first side 141 of the additional device dies D1, D2 and 108. In some examples, conductive features, such as metallization layer features of the first sides 131, 141 of the device dies PD1, PD2, D1, D2 and 108 are soldered to the first side of the lead frame structure 106 form electrical contacts to at least one of the switch terminals of the power switching devices PD1, PD2 as well as electrical contacts two circuit components of the other device dies D1, D2 and 108. Flip-chip type mounting procedures can be used in some examples, including applying solder paste to select locations on a lead frame interconnect structure 106, locating or placing the device dies PD1, PD2, D1, D2 and 108 on the lead frame structure 106, and re-flowing the solder paste in order to solder the dies to the lead frame 106. In this manner, circuit interconnections are provided with low resistance soldering connections to mitigate parasitic impedances associated with interconnection of the switching devices in circuit components within the module 100. Moreover, such solder connections reduce fabrication cost and time. Thus, the disclosed examples provide performance and cost advantages relative to wire-bonding interconnection processes, such as those shown in FIGS. 19 and 20.

As further shown in FIGS. 6 and 7, a substrate structure 110 supports the lead frame interconnect structure 106. In certain examples, the substrate structure 110 is formed of a thermally conductive material which is electrically insulating. Suitable materials which can be used to form the substrate 110 include ceramics such as aluminum nitride (AlN). The substrate structure includes a first side contacting at least a portion of the second side of the interconnect structure 106, as well as a second side (e.g., lower side in FIGS. 6 and 7). The substrate structure 110 provides a thermally conductive path to draw or direct heat away from the first side 131 of the power device dies PD1 and PD2, and also provides a thermally conductive path to draw heat away from the first sides 141 of the other included device dies D1, D2 and 108.

A body structure 102 is formed around portions of the power module 100. The body 102 includes upper and lower openings 104 for enhanced heat removal from one or more of the device dies PD1, PD2, D1, D2 and 108 in operation of the module 100. The body structure 102 may be formed of any suitable material. In one example, the body 102 is fabricated from an electrically insulating material. The material of the body structure 102 in one example is thermally insulating. Material of the body structure 102 in other examples is thermally conductive. The body structure 102 in certain embodiments is electrically insulative. In certain examples, the body structure 102 is formed by a molding process using a resin or plastic material. Other packaging processes can be used in other examples.

A first opening 104T is provided in the body 102 in the top side 102T of the power module example 100 of FIGS. 4-7. In this example, the opening 104T is a generally rectangular opening as best seen in FIG. 4. Other opening shapes can be used in other examples. The first opening 104T exposes at least a portion of the second side of the substrate 110 to which the leadframe 106 and ultimately the device dies PD1, PD2, D1, D2 and 108 are thermally coupled. The thermally conductive path from the first side 131 of the power device dies PD1 and PD2, and from the first sides 141 of the other included device dies D1, D2 and 108 through the lead frame structure 106 and the substrate 110 allows heat to be removed from the device dies PD1, PD2, D1, D2 and 108. The opening 104T presents and an exposed surface ES1 of the substrate 110. The heat removal can be through exposure of the exposed substrate surface ES1 to external ambient of the power module 100 when installed on a printed circuit board or printed wiring board. In other applications, a heat sink can be bolted, clamped, or otherwise mounted to the exposed surface ES1 along the top side 102T of the power module 100 as shown in the examples of FIGS. 14-17 below.

The body 102 in one example also includes a pair of second openings 104B-1 and 104B-2 providing exposed surfaces ES2-1 and ES2-2 exposing all or at least portions of the second side s 132 of the power device dies PD1 and PD2, respectively. As shown in FIG. 6, the second sides 132 of the device dies PD1 and PD2 in one example are generally flat and co-planar with the bottom side 102B of the body 102. Any number of one or more bottom side openings 104B can be used. For example, power modules with one, two, four or six power device dies can include a corresponding number of bottom side openings 104B to expose second sides of the power device dies to enhance heat removal. The bottom side exposed surfaces ES2-1, ES2-2 of the device dies PD1, and PD2 in one example include one or more conductive features which can be soldered to corresponding conductive pads on a host printed circuit board. In this manner, multiple thermally conductive paths can be provided to draw heat away from the switches 101 within the device dies PD1 and PD2. A module with very low thermal impedance is therefore created with both top and bottom side cooling features.

Figure 15:
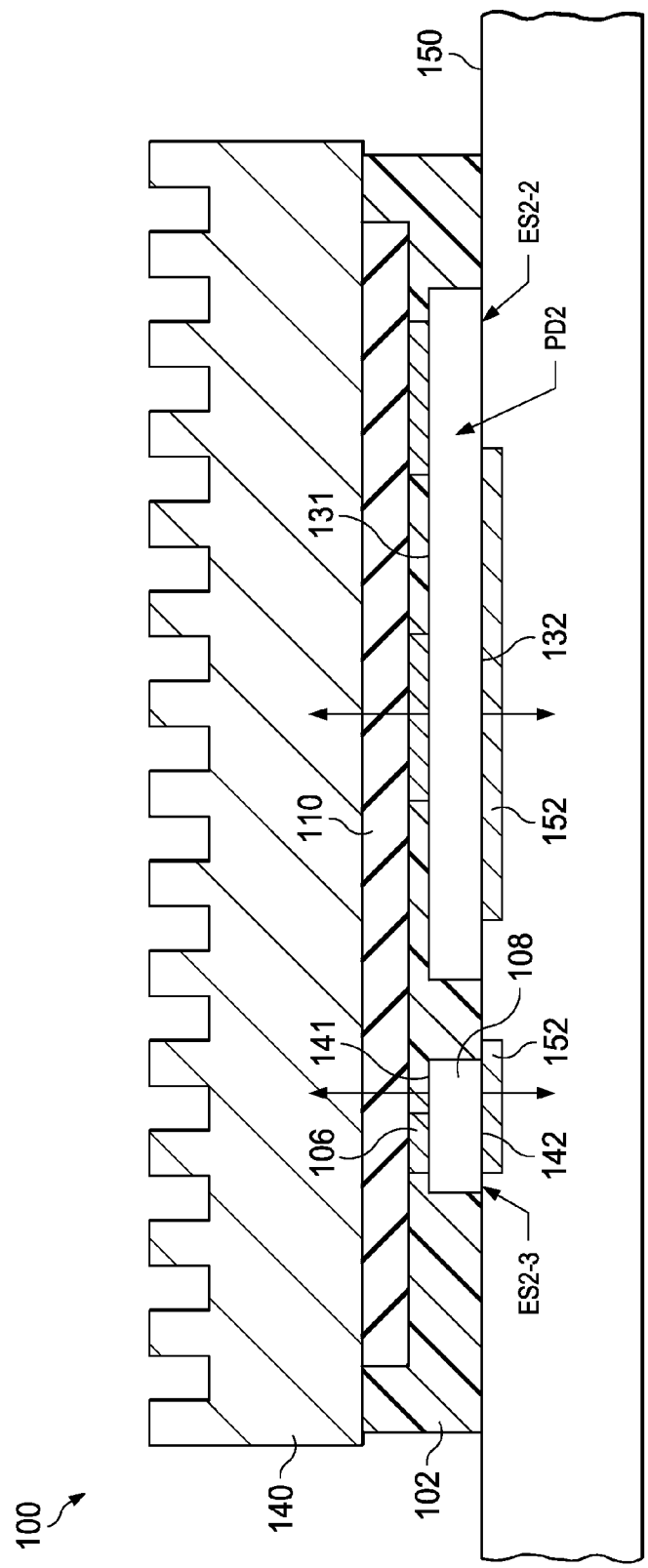
FIG. 15 is a partial sectional side elevation view of another example power module on a printed circuit board with an overlying heat sink for drawing heat upward from a first side of an IGBT power device through the first exposed surface and downward from a bottom side of the IGBT power device and from a driver circuit through second exposed surface.

The reverse recovery diode and driver circuit device dies D1, D2 and 108 in FIGS. 6 and 7 have second sides 142 below the second sides 132 of the power device dies PD1 and PD2, and are covered by the body material 102. In other examples, additional openings are provided in the bottom side 102B of the body 102 to expose at least a portion of the second side 142 of one, some or all of the further device dies device dies D1, D2 and 108 along the bottom 102B of the power module 100 to help remove heat from these devices, as shown in FIG. 15 below.

The first side of the interconnect structure 106 contacts at least a portion of the first sides 131 of the power device dies PD1 and PD2, and also contacts at least a portion of the first sides 141 of the other included device dies D1, D2 and 108. In at least one example, the first side of the interconnect structure 106 forms electrical contacts to at least one of the switch terminals of the switching devices 101 and forms at least one electrical contact to the electrical circuit components of the further device dies D1, D2 and 108. The lead frame interconnect structure 106 in some examples provides external electrical connectivity to the device components and provides internal interconnection of the switches 101 and associated diodes D1 and D2 as well as the driver circuitry 108 by direct solder connections of conductive features of the device dies PD1, PD2, D1, D2 and 108 to the conductive interconnect structure 106 without wire-bond connections. This feature advantageously provides control over parasitic impedances in the power supply circuit operation, as well as improved heat removal. Moreover, fabrication is economical and fast, with the dies PD1, PD2, D1, D2 and 108 being soldered to solder paste locations on the lead frame interconnect structure 106. In use, the lead frame leads and conductive features on the second sides 132, 142 of the exposed device dies PD1, PD2, D1, D2 and 108 are soldered to pads on a host circuit board for electrical interconnection and thermal transfer.

FIGS. 8 and 9 show another power module example 100 generally as described above in connection with FIGS. 4-7. FIG. 8 shows a section view along line 6-6 of FIG. 5 and FIG. 9 shows a section view along line 7-7 of FIG. 5. Unlike the example of FIGS. 6 and 7, the example of FIGS. 8 and 9 includes a thermally conductive and electrically insulating substrate structure 110 formed of ceramic or MN or other suitable materials including a first side contacting at least a portion of the second side of the thermally and electrically conductive interconnect structure 106. In addition, this example includes a conductor structure 112 formed of a thermally and electrically conductive material. The conductor structure 112 includes a first side contacting at least a portion of a second side of the substrate 110. The substrate 110 and conductor 112 are joined in one example by direct copper bonding (DBC) fabrication methods and processes or other suitable technique. The substrate 110 and the conductor structure 112 provide a thermally conductive path to draw heat away from the first sides 131 of the first device dies PD1 and PD2. The body structure 102 in this example includes openings 104T along the top side 102T and one or more openings 104B as previously described. However, the first opening 104T exposes at least a portion of the second side of the conductor structure 112 to provide the externally accessible first exposed surface ES1 of the conductor structure 112 along the top 102T of the power module 100. In this manner, the exposed surface ES1 of the conductor structure 112 provides a thermally conductive path through the substrate structure 110 and the conductor structure 112 to draw heat away from the first sides 131 of the first device dies PD1 and PD2.

Figure 13:
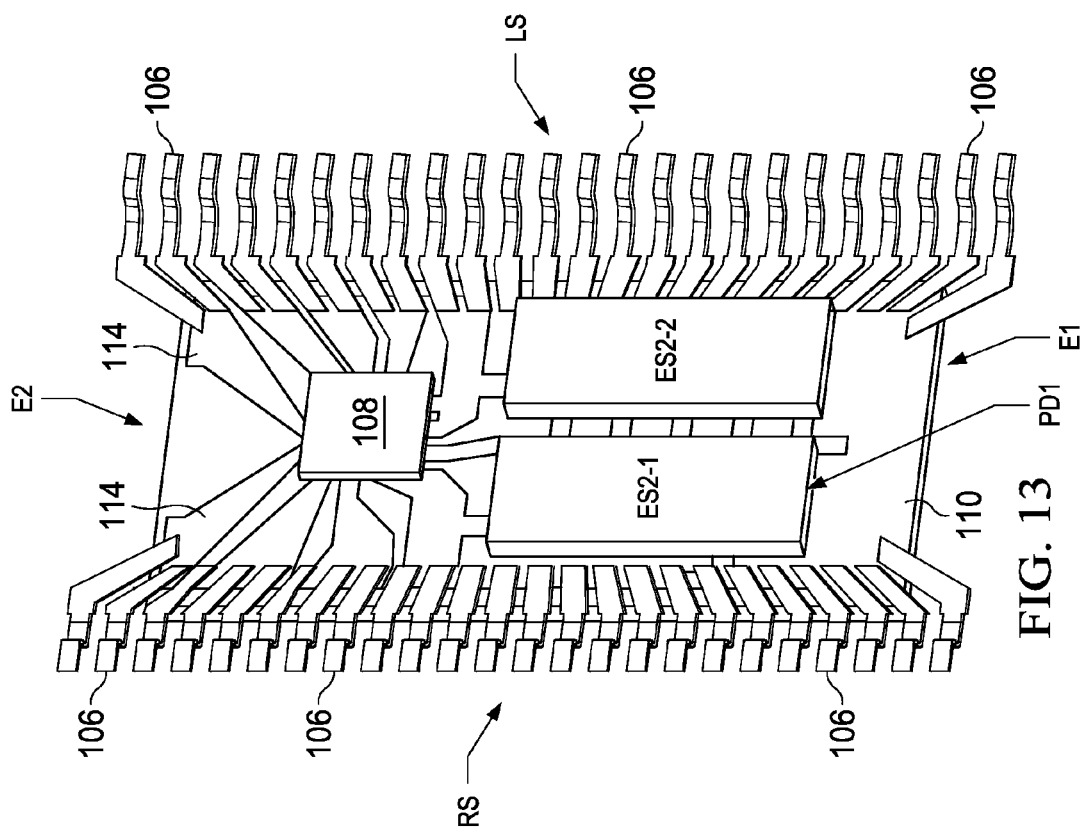
FIG. 13 is a bottom perspective view showing the power module of FIGS. 1, 4-7 and 10-12 prior to encapsulation in the molding process.
Figure 12:
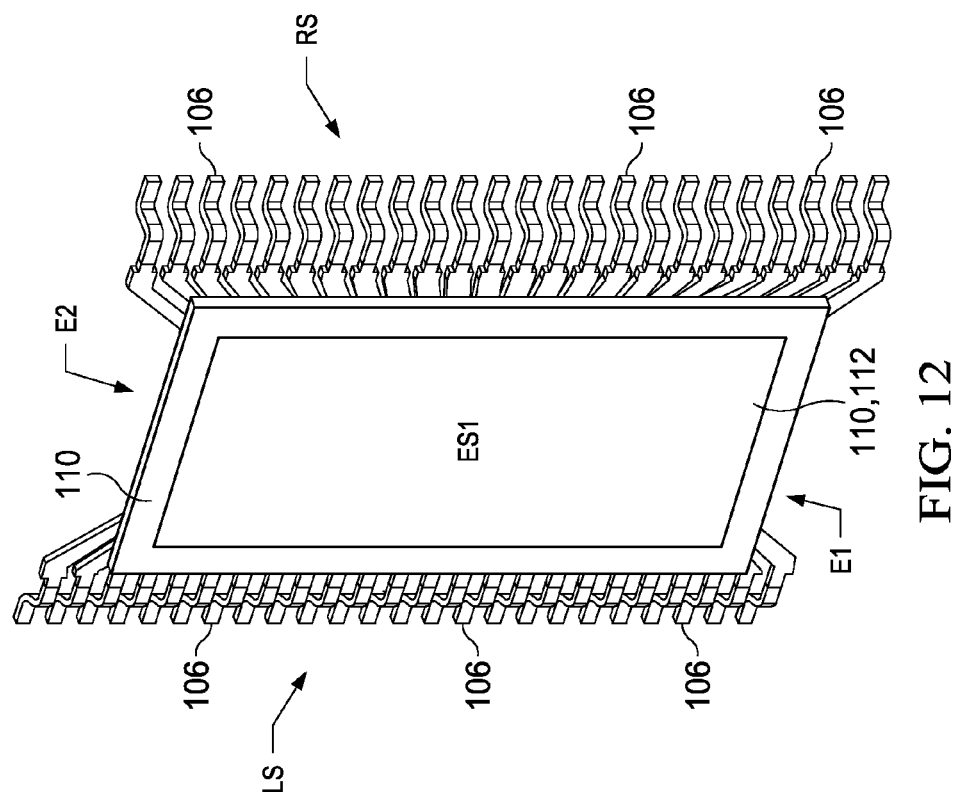
FIG. 12 is a top perspective view showing the power module of FIGS. 1, 4-7, 10 and 11 prior to partial encapsulation in a molding process.

FIGS. 10 and 11 show top and bottom perspective views of the power module 100 of FIGS. 1, and 4-7, and FIGS. 12 and 13 show top and bottom perspective views of the power module 100 before the device is molded to form the body structure 102. The exposed surface ES1 along the top side 102T of the module 100 in FIGS. 10 and 12 can be a surface of the substrate 110 in the example of FIGS. 6 and 7 above. In another example, the exposed surface ES1 in FIGS. 10 and 12 is a surface of the conductor structure 112 in the example of FIGS. 8 and 9. As shown in FIG. 13, the lead frame interconnect structure 106 in this example includes conductive features 114 within the perimeter of the underlying substrate 110 to which one or more device dies can be soldered to form electrical interconnections, in which connect to externally exposed leads or pens for interconnection to a host printed circuit board. The partially assembled power module 100 is shown in FIGS. 12 and 13 after the power device dies PD1 and PD2 and the driver die 108 have been soldered to the lead frame interconnect structure 106 using flip-chip assembly techniques.

Figure 14:
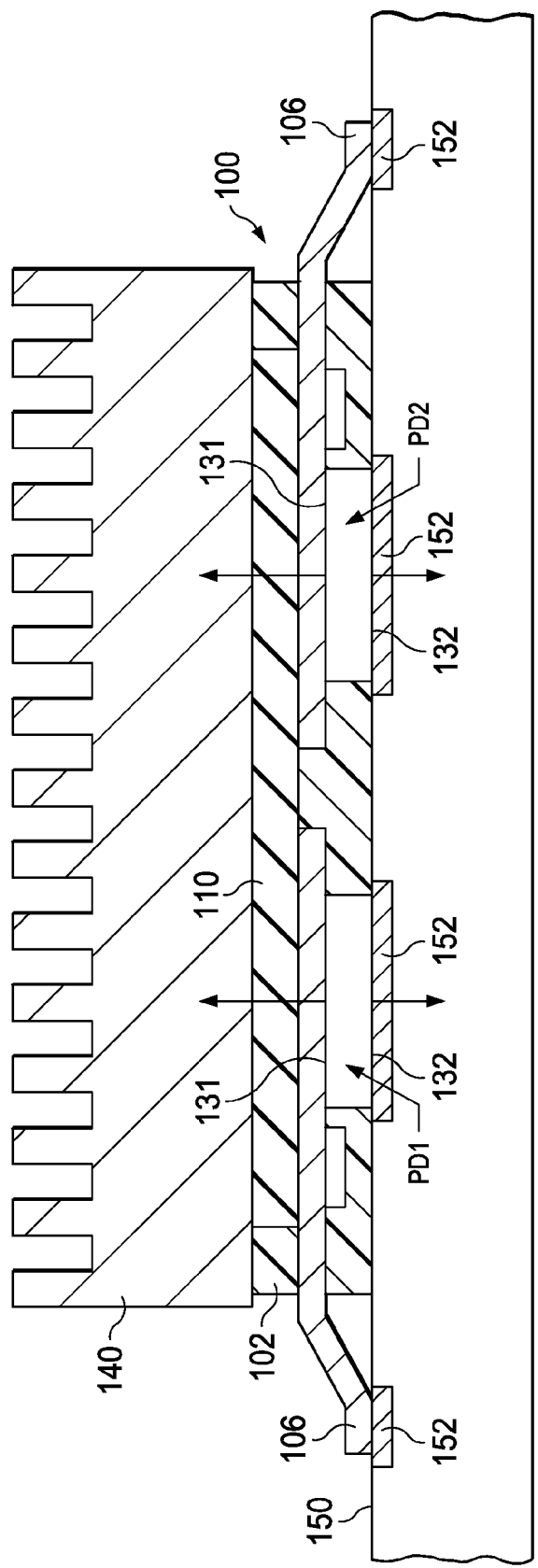
FIG. 14 is a partial sectional side elevation view of the power module of FIGS. 1, 4-7 and 10-13 assembled on a printed circuit board with an overlying heat sink for drawing heat upward from a first side of the IGBT power devices through the first exposed surface and downward from a bottom side of the IGBT power devices through the pair of second exposed surfaces.

FIG. 14 is a partial section view of the power module of FIGS. 1, 4-7 and 10-13 assembled on a host printed circuit board (PCB) 150. The PCB 150 includes one or more conductive features such as copper or aluminum pads 152. In this example, the externally extending leads of the lead frame interconnect structure 106 and the second sides of the power device dies PD1 and PD2 are soldered to corresponding conductive features 152 on the host PCB 150. In this example, soldering of the interconnect structure 106 and the second sides 132 of the device dies PD1 and PD2 to the conductive pads 152 provides electrical interconnection as well as thermal coupling for improved heat sinking. In this example, the upper exposed surface of the substrate 110 interfaces with a lower side of a heatsink structure 140 creating a first thermally conductive path from the first side 131 of the power device dies PD1 and PD2 through the lead frame interconnect structure 106 and the substrate 110 to draw heat upward (shown by arrows in FIG. 14) for dissipation by the upwardly extending cooling fans of the heatsink 140. In addition, soldering of conductive features of the second sides 132 of the device dies PD1 and PD2 to the conductive pads 152 on the host PCB 150 provides a second thermally conductive path to draw heat downward from the power device dies PD1 and PD2 through the conductive pads are traces 152 and into the body of the PCB 150. As seen in FIG. 14, the provision of dual cooling paths advantageously extends the heat removal capacity of the module 100 for cooling the semiconductor switches (e.g., IGBTs, MOSFETs, etc.) of the power device dies PD1 and 2.

FIG. 15 is a partial sectional view of another example power module 100 installed on a host PCB 150. In this example, the second side 142 of the driver circuit die 108 is generally coplanar with the second side 132 of the power device die PD2, and a corresponding opening is provided in the body structure 102 to expose at least a portion of the second side or surface 142 of the driver circuit die 108. This exposed second side 142 in one example includes a metallic feature (e.g., of a metallization layer formed during fabrication of the driver circuit die 108) that is soldered to a conductive trace or pad 152 on the upper side of the host PCB 150. In this manner, multidirectional the removal is provided for the driver circuit device die 108 as well as for the power device dies PD1 and PD2, shown by the upward and downward facing arrows in FIG. 15.

Figure 16:
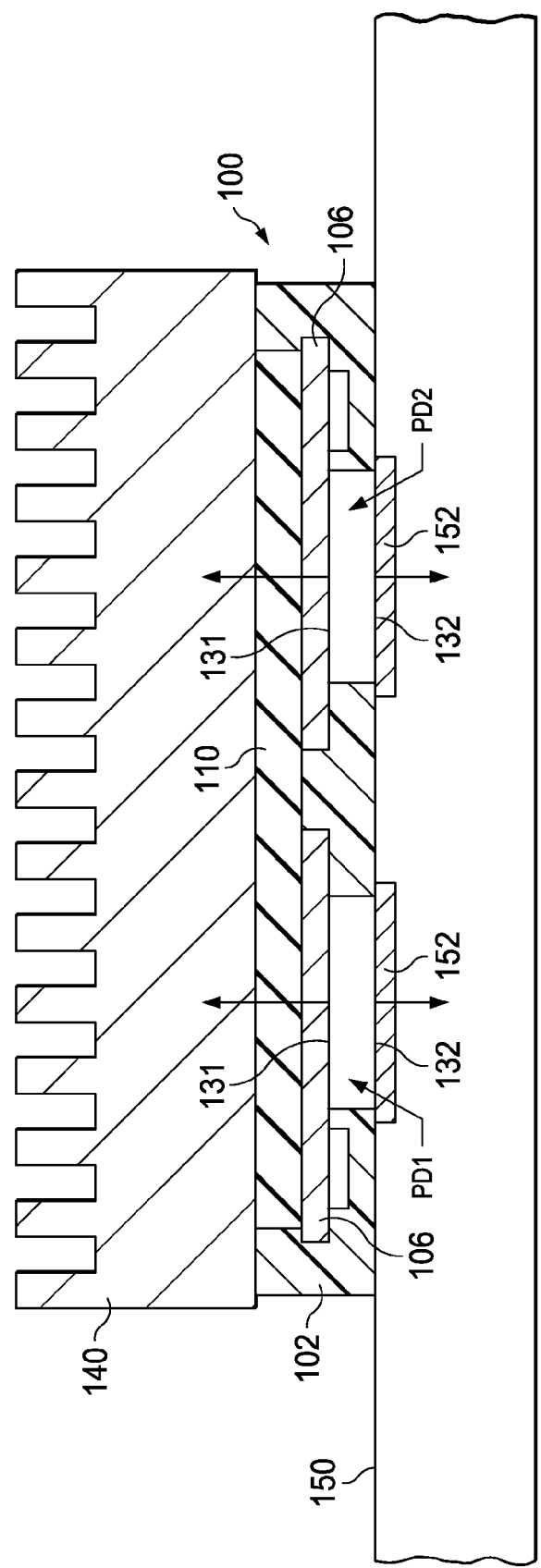
FIG. 16 is a partial sectional side elevation view of another example power module with flip-chip connections to a printed circuit board with an overlying heat sink for drawing heat upward from a first side of the IGBT power devices through the first exposed surface and downward from a bottom side of the IGBT power devices through second exposed surfaces.

FIG. 16 shows another example power module 100 mounted to a printed circuit board 150. Unlike the example of FIG. 14, the power module 100 and FIG. 16 is connected to the PCB 150 entirely by bottom-side conductive features soldered to circuit board pads 152, and does not include gull-wing or through-hole leads. In this manner, a compact form factor module 100 is provided, with the multi-directional cooling features described above.

Figure 17:
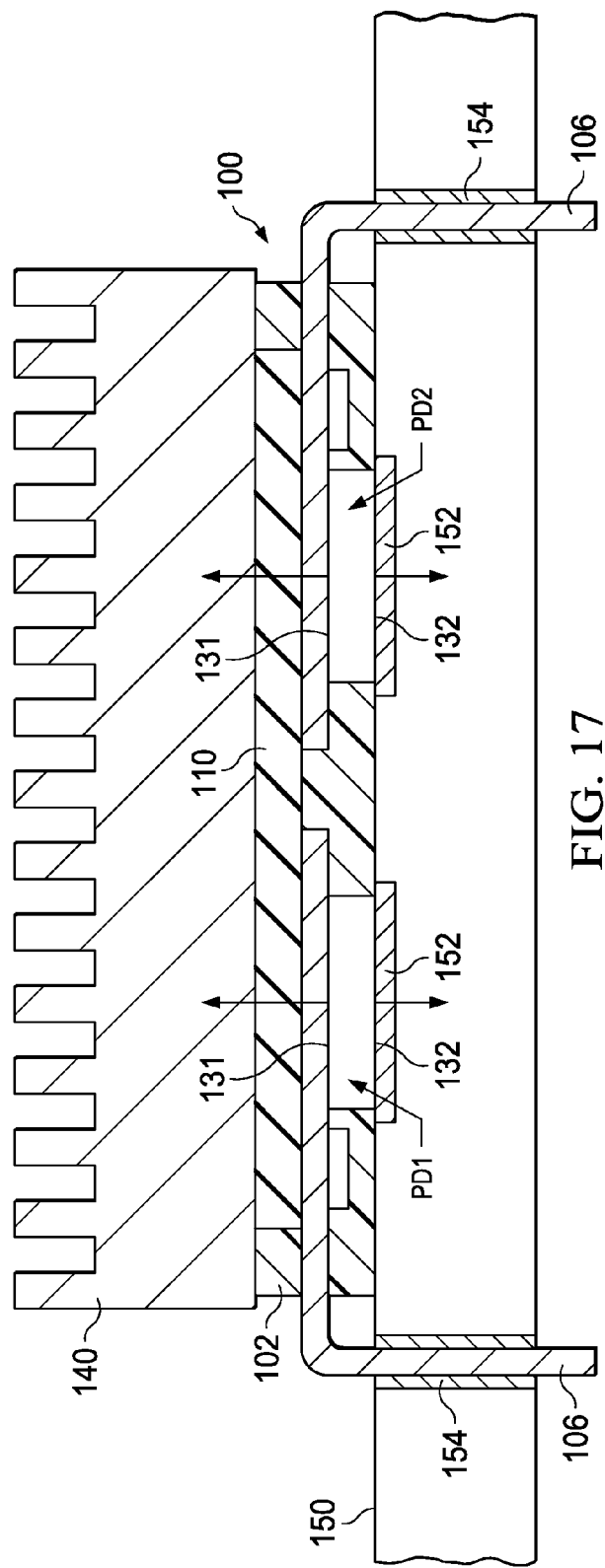
FIG. 17 is a partial sectional side elevation view of another example power module of FIGS. 1, 4-7 and 10-13 with through-hole pins assembled on a printed circuit board with an overlying heat sink for drawing heat upward from a first side of the IGBT power devices through the first exposed surface and downward from a bottom side of the IGBT power devices through the pair of second exposed surfaces.

FIG. 17 shows another example power module 100 with multi-directional cooling for power device dies PD1 and PD2 as described above. In this example, the lead frame interconnect structure 106 includes through-hole external pins or leads 106 which can be extended through the PCB 150 using plated through holes 154 for soldering the module 100 to the PCB 150.

Figure 18:
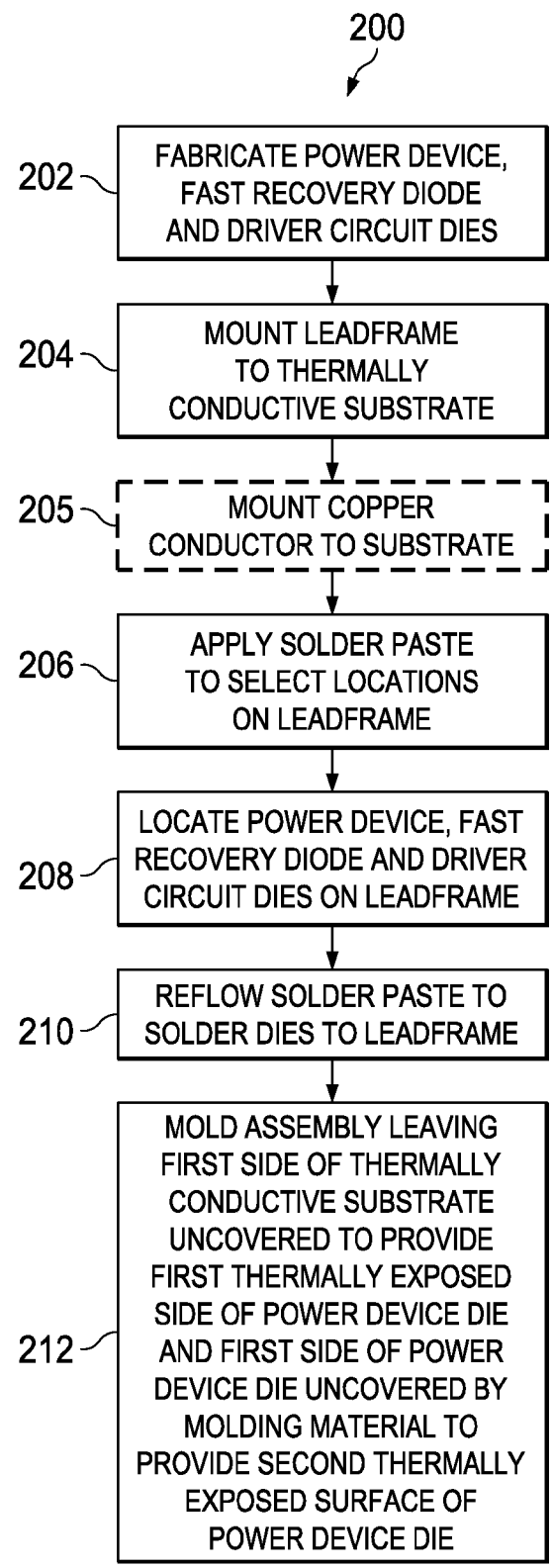
FIG. 18 is a flow diagram of a process for fabricating the power module of FIGS. 1, 4-7 and 10-14. (Confused about Step 205—what is that?—Did you want to compare that with a prior art flow which has at least two types of wire bonding—one for the IC with finer wire and one ribbon/heavy gage Al wire for the power device)

FIG. 18 is a flow diagram illustrating a method 200 of fabricating a power module, such as the above-described power modules 100. At 202, one or more device dies are fabricated. In one example, one or more power device dies PD1, PD2 are provided along with one or more further device dies such as fast recovery diode dies D1, D2 and a driver circuit device die 108 as described above. As previously noted, switch device dies PD1 and PD2 may be of any suitable type, where IGBT-type device dies PD1 and PD2 may be provided at 202 along with corresponding reverse recovery diode device dies D1 and D2, or the diode devices may be omitted where MOSFET-type switch device dies PD1 and PD2 are used. Moreover, any suitable number of one or more power device dies PD may be fabricated along with at least one further device die at 202. The method 200 includes mounting an electrically and thermally conductive lead frame or other interconnect structure 106 to a thermally conductive substrate structure 110 at 204. In some embodiments, a thermally and electrically conductive conductor structure 112 (e.g., copper) is mounted at 205 to the substrate structure 110, for example, as shown in FIGS. 8 and 9. In other embodiments, the step 205 is omitted (e.g., FIGS. 6 and 7 above).

At 206, 208 and 210, first and second device dies (e.g., PD1, D1, 108) are mounted to the interconnect structure 106 to form at least one electrical contact to at least one switching terminal of a switching device in the first device die PD1, and to form at least one electrical contact to an electrical circuit component of the second device die D1, 108. For example, solder paste is applied at 206 to select locations on the lead frame interconnect structure 106, and the device dies PD1, D1 and 108 are located or positioned on the interconnect structure 106 at 208. At 210, the solder paste is reflowed in order to solder the dies PD1, D1 and 108 to the interconnect structure 106. In the above illustrated examples, this process solders one or more conductive features of first sides 131 of the device dies PD1, PD2 and conductive features of a first side 141 of the further included device dies D1, D2, 108 to the first side of the interconnect structure 106 to form corresponding electrical contacts.

At 212, an electrically insulating body structure 102 is formed around portions of the power module 100 using any suitable formation techniques. In one example, a molding process is used at 212 to form a molded resin body structure 102. The molding process in one example includes providing a first opening 104T exposing at least a portion of the substrate structure 110 (or any included conductor structure 112) to provide an externally accessible first exposed surface ES1 along a top 102T of the power module 100. In addition, the molding process at 212 in one example includes providing a second opening (e.g., one or more bottom-side openings 104B above) exposing at least a portion of the power device die or dies PD1, PD2 in order to provide one or more externally accessible second exposed surface (e.g., ES2-1 and ES2-2 as seen above) along the bottom 102B of the power module 100. As shown in FIG. 15, one or more additional openings may be provided in the molding process at 212 to expose at least a portion of one or more further device dies (e.g., D1, D2 and/or 108) to provide corresponding externally accessible additional exposed surfaces along the bottom 102B of the power module 100 to further enhance the removal.

Described examples facilitate enhanced heat dissipation compared with conventional power modules and fabrication techniques. The subsequent overall net thermal resistance reduction allows higher current carrying capability for a given module size and form factor, and the described techniques also provide improved control over parasitic impedances by facilitating construction without wire-bonding interconnects. In use, the resulting power modules 100 utilize underlying host printed circuit board structures and/or associated heat sinks to allow heat removal from two faces of a device die included within the module 100.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A power module, comprising:
   a first device die, including: a first side, a second side, and a switching device with a plurality of switch terminals;
   a second device die including a first side, a second side, and at least one electrical circuit component;
   an interconnect structure formed of a thermally and electrically conductive material, the interconnect structure including a first side contacting at least a portion of the first side of the first device die, the first side of the interconnect structure contacting at least a portion of the first side of the second device die, the first side of the interconnect structure forming electrical contacts to at least one of the switch terminals of the switching device of the first device die and forming at least one electrical contact to the electrical circuit component of the second device die;
   a substrate structure formed of a thermally conductive material, the substrate structure including a first side contacting at least a portion of a second side of the interconnect structure, and a second side, the substrate structure providing a thermally conductive path to draw heat away from the first side of the first device die; and
   a body structure formed of an electrically insulating material, the body structure extending around portions of the power module, the body structure including:

a first opening exposing at least a portion of the second side of the substrate structure to provide an externally accessible first exposed surface of the substrate structure along a top of the power module providing a thermally conductive path through the substrate structure to draw heat away from the first side of the first device die, and a second opening exposing at least a portion of the second side of the first device die to provide an externally accessible second exposed surface of the first device die along a bottom of the power module providing a thermally conductive path to draw heat away from the second side of the first device die.

2. The power module of claim 1, wherein at least one conductive feature of the first side of the first device die is soldered to the first side of the interconnect structure to form an electrical contact to at least one of the switch terminals of the switching device, and wherein at least one conductive feature of the first side of the second device die is soldered to the first side of the interconnect structure to form at least one electrical contact to the electrical circuit component of the second device die.

3. The power module of claim 1, wherein the interconnect structure is a leadframe structure including at least one lead extending out from one of a side of the body structure and a bottom of the body structure.

4. The power module of claim 1, wherein the switching device of the first device die is an insulated gate bipolar transistor, and wherein the at least one electrical circuit component of the second device die is a diode.

5. The power module of claim 1, wherein the second device die includes a driver circuit to provide a control signal to the switching device of the first device die.

6. The power module of claim 1, wherein the switching device of the first device die is a field effect transistor.

7. The power module of claim 1, wherein the body structure includes an additional opening exposing at least a portion of the second side of the second device die to provide an externally accessible additional exposed surface of the second device die along the bottom of the power module providing a thermally conductive path to draw heat away from the second side of the second device die.

8. The power module of claim 1, comprising a further device die, the further device die including: a first side, a second side, and a further switching device with a plurality of switch terminals;

wherein the first side of the interconnect structure contacts at least a portion of the first side of the further device die to form at least one electrical contact to at least one of the switch terminals of the further switching device; and wherein the body structure includes an additional opening exposing at least a portion of the second side of the further device die to provide an externally accessible further exposed surface of the further device die along the bottom of the power module providing a thermally conductive path to draw heat away from the second side of the further device die.

9. A power module, comprising:

a first device die, including: a first side, a second side, and a switching device with a plurality of switch terminals;

a second device die including a first side, a second side, and at least one electrical circuit component;

an interconnect structure formed of a thermally and electrically conductive material, the interconnect structure including a first side contacting at least a portion of the first side of the first device die, the first side of the interconnect structure contacting at least a portion of the first side of the second device die, the first side of the interconnect structure forming electrical contacts to at least one of the switch terminals of the switching device of the first device die and forming at least one electrical contact to the electrical circuit component of the second device die;

a substrate structure formed of a thermally conductive material, the substrate structure including a first side contacting at least a portion of a second side of the interconnect structure, and a second side;

a conductor structure formed of a thermally and electrically conductive material, the conductor structure including a first side contacting at least a portion of a second side of the substrate structure, and a second side, the substrate structure and the conductor structure providing a thermally conductive path to draw heat away from the first side of the first device die; and a body structure formed of an electrically insulating material, the body structure extending around portions of the power module, the body structure including:

a first opening exposing at least a portion of the second side of the conductor structure to provide an externally accessible first exposed surface of the conductor structure along a top of the power module providing a thermally conductive path through the substrate structure and the conductor structure to draw heat away from the first side of the first device die, and a second opening exposing at least a portion of the second side of the first device die to provide an externally accessible second exposed surface of the first device die along a bottom of the power module providing a thermally conductive path to draw heat away from the second side of the first device die.

10. The power module of claim 9, wherein at least one conductive feature of the first side of the first device die is soldered to the first side of the interconnect structure to form an electrical contact to at least one of the switch terminals of the switching device, and wherein at least one conductive feature of the first side of the second device die is soldered to the first side of the interconnect structure to form at least one electrical contact to the electrical circuit component of the second device die.

11. The power module of claim 9, wherein the interconnect structure is a leadframe structure including at least one lead extending out from one of a side of the body structure and a bottom of the body structure.

12. The power module of claim 9, wherein the switching device of the first device die is an insulated gate bipolar transistor, and wherein the at least one electrical circuit component of the second device die is a diode.

13. The power module of claim 9, wherein the second device die includes a driver circuit to provide a control signal to the switching device of the first device die.

14. The power module of claim 9, wherein the switching device of the first device die is a field effect transistor.

15. The power module of claim 9, wherein the body structure includes an additional opening exposing at least a portion of the second side of the second device die to provide an externally accessible additional exposed surface of the second device die along the bottom of the power module providing a thermally conductive path to draw heat away from the second side of the second device die.

16. The power module of claim 9, comprising a further device die, the further device die including: a first side, a second side, and a further switching device with a plurality of switch terminals;

wherein the first side of the interconnect structure contacts at least a portion of the first side of the further device die to form at least one electrical contact to at least one of the switch terminals of the further switching device; and wherein the body structure includes an additional opening exposing at least a portion of the second side of the further device die to provide an externally accessible further exposed surface (ES2-2) of the further device die along the bottom of the power module providing a thermally conductive path to draw heat away from the second side of the further device die.

17. A method of fabricating a power module, the method comprising:

mounting an electrically and thermally conductive interconnect structure to a thermally conductive substrate structure;

mounting first and second device dies to the interconnect structure to form at least one electrical contact to at least one switching terminal of a switching device in the first device die, and to form at least one electrical contact to an electrical circuit component of the second device die; and forming an electrically insulating body structure around portions of the power module, the body structure including providing a first opening exposing at least a portion of the substrate structure to provide an externally accessible first exposed surface of the substrate structure along a top of the power module, and providing a second opening exposing at least a portion of the first device die to provide an externally accessible second exposed surface of the first device die along a bottom of the power module.

18. The method of claim 17, wherein mounting the first and second device dies to the interconnect structure comprises:

soldering at least one conductive feature of a first side of the first device die to a first side of the interconnect structure to form an electrical contact to at least one switch terminal of the switching device; and soldering at least one conductive feature of a first side of the second device die to the first side of the interconnect structure to form at least one electrical contact to the electrical circuit component of the second device die.

19. The method of claim 17, wherein forming an electrically insulating body structure comprises providing an additional opening exposing at least a portion of the second device die to provide an externally accessible additional exposed surface of the second device die along the bottom of the power module.

20. The method of claim 17, further comprising mounting a thermally and electrically conductive conductor structure to the substrate structure; wherein the first opening of the body structure exposes at least a portion of the conductor structure to provide the externally accessible first exposed surface of the conductor structure along the top of the power module.

* * * * *